United States Patent
Lee (12)

(10) Patent No.: US 10,763,358 B2
(45) Date of Patent: Sep. 1, 2020

(54) HIGH VOLTAGE SEMICONDUCTOR DEVICE AND METHOD OF MANUFACTURING SAME

(71) Applicant: DB HiTek Co., Ltd., Seoul (KR)

(72) Inventor: Jong Ho Lee, Incheon (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 16/215,017

(22) Filed: Dec. 10, 2018

(65) Prior Publication Data

US 2020/0044079 A1  Feb. 6, 2020

(30) Foreign Application Priority Data

Aug. 2, 2018  (KR) .............................. 20180090424

(51) Int. Cl.

| | | |
|---|---|---|
| *H01L 29/78* | (2006.01) | |
| *H01L 29/423* | (2006.01) | |
| *H01L 29/66* | (2006.01) | |
| *H01L 29/06* | (2006.01) | |
| *H01L 29/45* | (2006.01) | |

(52) U.S. Cl.
CPC ...... *H01L 29/7816* (2013.01); *H01L 29/0653* (2013.01); *H01L 29/42364* (2013.01); *H01L 29/456* (2013.01); *H01L 29/66681* (2013.01)

(58) Field of Classification Search
CPC ........... H01L 29/7816; H01L 29/66681; H01L 29/7824; H01L 29/0653
See application file for complete search history.

(56) References Cited

U.S. PATENT DOCUMENTS

| | | | | |
|---|---|---|---|---|
| 6,252,278 B1 * | 6/2001 | Hsing | ................. | H01L 29/0878 257/335 |
| 8,004,039 B2 * | 8/2011 | Zinn | ................... | H01L 29/0653 257/339 |
| 9,520,493 B1 | 12/2016 | Kim et al. | | |
| 2002/0100951 A1 * | 8/2002 | Yasuhara | .............. | H01L 29/402 257/491 |
| 2012/0187483 A1 * | 7/2012 | Yang | .................. | H01L 29/0692 257/336 |

FOREIGN PATENT DOCUMENTS

KR    20170060210 A    6/2017

OTHER PUBLICATIONS

Dae Noon Kim et al.; "High Voltage Integrated Circuit Having Improved on Resistance and Breakdown Voltage"; Bibliographic data of KR20170060210 (A); Jun. 1, 2017; https://worldwide.espacenet.com.

* cited by examiner

*Primary Examiner* — Hsien Ming Lee
(74) *Attorney, Agent, or Firm* — Andrew D. Fortney; Central California IP Group, P.C.

(57) ABSTRACT

Disclosed is a high voltage semiconductor device and a method of manufacturing the same.

17 Claims, 9 Drawing Sheets

HIGH VOLTAGE SEMICONDUCTOR DEVICE AND METHOD OF MANUFACTURING SAME

CROSS REFERENCE TO RELATED APPLICATION

This application claims the benefit of Korean Patent Application No. 2018-0090424, filed Aug. 2, 2018, which is hereby incorporated by reference in its entirety into this application.

BACKGROUND OF THE INVENTION

1. Technical Field

The present invention relates to a high voltage semiconductor device and a method of manufacturing the same.

2. Description of the Related Art

A laterally diffused metal oxide semiconductor (LDMOS) transistor has a rapid switching response and high input impedance. Thus, the LDMOS transistor is widely used in power device applications. Hereinafter, a general N-channel LDMOS device and a method of manufacturing the same will be described in detail.

Figure 1:
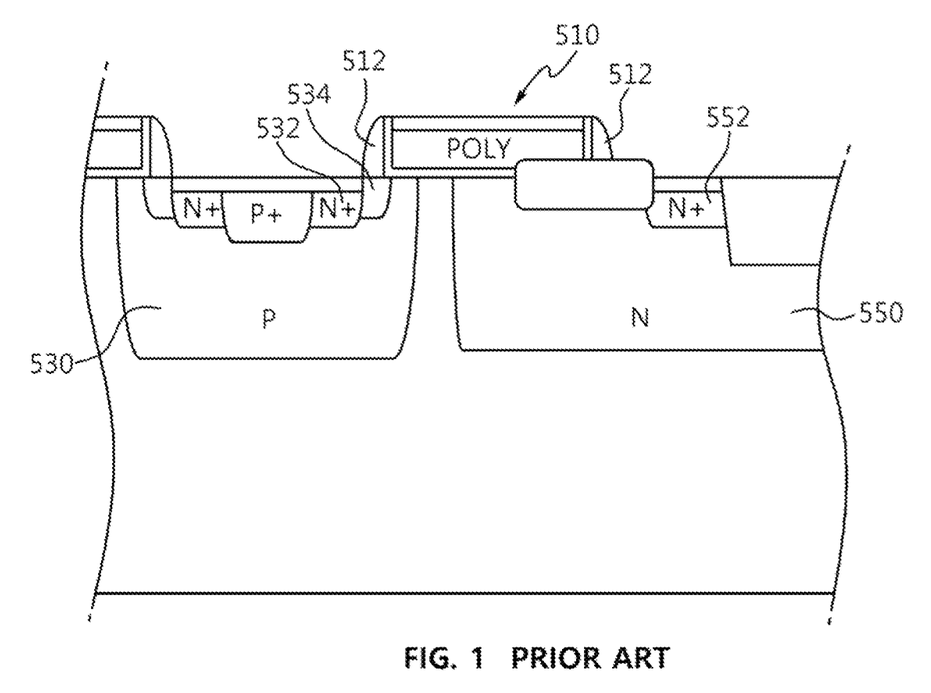
FIG. 1 is a cross-sectional view illustrating a high voltage semiconductor device of the related art.

FIG. 1 is a cross-sectional view illustrating a high voltage semiconductor device of the related art.

Referring to FIG. 1, the LDMOS device of the related art includes a gate structure 510 on a substrate, and a first-conductivity type body region 530 and a second-conductivity type drift region 550, which are below the surface of the substrate and spaced apart from each other. Opposite sidewalls of the gate structure 510 are capped with a spacer 512. A second-conductivity-type heavily doped region 532 and a second-conductivity-type lightly doped region 534, which are described later, are in the body region 530.

The second-conductivity-type heavily doped region 532 and the second-conductivity-type lightly doped region 534 are on an upper side of the body region 530 below the surface of the substrate.

A second-conductivity-type heavily doped drain region 552 is in an upper side of the drift region 550 below the surface of the substrate.

Figure 2:
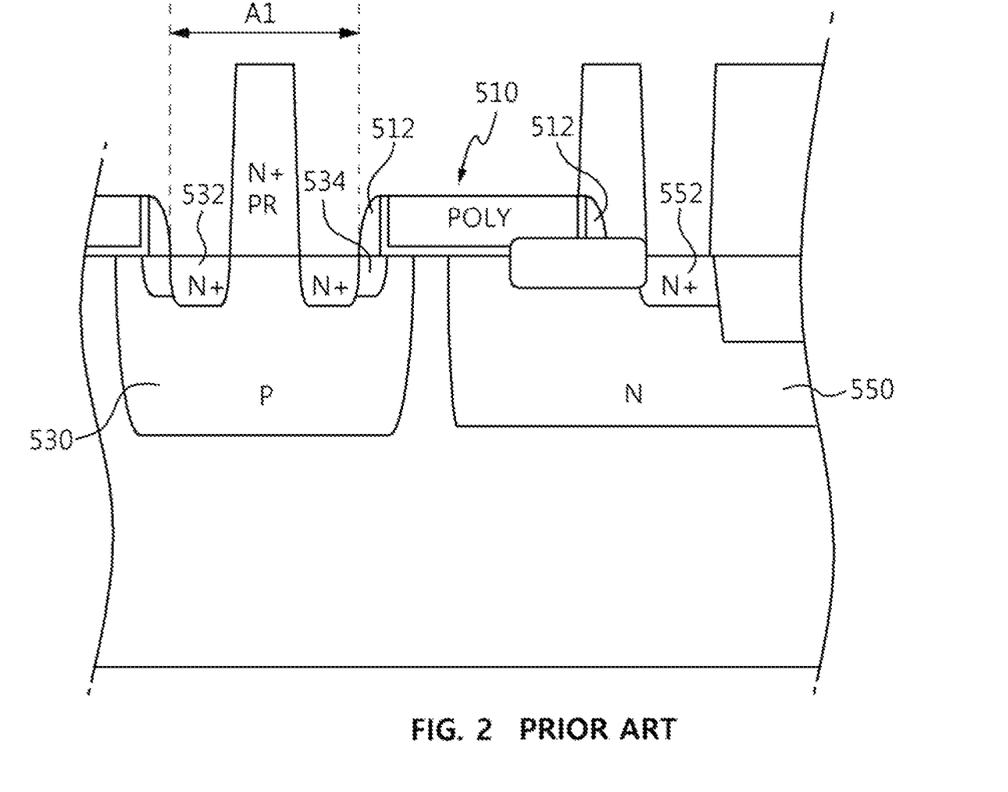
FIG. 2 is a cross-sectional view illustrating a process of forming a second-conductivity-type heavily doped region on a side of a body region of the high voltage semiconductor device of the related art.

FIG. 2 is a cross-sectional view illustrating a process of forming the second-conductivity-type heavily doped region on a first side of the body region of the high voltage semiconductor device of the related art.

A step of manufacturing a source region will be described with reference to FIG. 2. In order to form the source region having a narrow width, a photoresist (PR) mask is formed on the surface of the substrate, except for a position where the source region is formed in a space A1 between adjacent gates. At this point, when the mask is not formed in at a predetermined width, a PR profile may be changed or attached to the sidewall of the adjacent gate structure 510, due to a deformation of the photoresist. Thus, in order to form the source region stably, the mask formed in the space A1 is required to have a predetermined width. Accordingly, the space A1 between adjacent gate structures 510 (e.g., the space between adjacent spacers 512 of the adjacent gate structures 510) is required to have a minimum predetermined width, which means that the body region 530 is required to have a corresponding minimum predetermined width. Therefore, miniaturization of the LDMOS device, and particularly reducing the width of the body region 530, is limited. In addition, improvement of specific on-resistance (Rsp) characteristics of the LDMOS device is limited.

In order to solve the above-mentioned problems of the related art, the present invention may relate to a high voltage semiconductor device and a method of manufacturing the same that minimize the width of a region corresponding to the conventional body region 530, such that it is possible to achieve miniaturization of the device and improve its specific on-resistance characteristics.

SUMMARY OF THE INVENTION

Accordingly, the present invention has been made keeping in mind the above problems occurring in the related art, and the present invention relates to a high voltage semiconductor device and a method of manufacturing the same, in which forming a heavily doped region having a narrow width in a body region is not required, such that it is not necessary to form a photoresist mask in a space between a pair of adjacent gate electrodes and on a substrate and to form the mask with a width of a predetermined minimum size for the formation of the heavily doped region, whereby the width of the body region of the device may be reduced.

In addition, the present invention relates to a high voltage semiconductor device and a method of manufacturing the same, in which it is possible to achieve miniaturization of the device and improve specific on-resistance characteristics.

In addition, the present invention relates to a high voltage semiconductor device and a method of manufacturing the same in which a separate process for forming an N+ source region is omitted, such that it is possible to simplify a manufacturing process and reduce cost.

In addition, the present invention relates to a high voltage semiconductor device and a method of manufacturing the same, in which a separate process for forming an N+ source region is omitted, such that it is possible to overcome limitations of a design rule that restricts formation of a photoresist pattern for the source region.

In addition, the present invention relates to a high voltage semiconductor device and a method of manufacturing the same, in which a spacer is not formed on a sidewall of a gate electrode adjacent to the source region, such that the width of the body region is reduced by the width of the spacer, whereby it is possible to achieve miniaturization of the device and improve specific on-resistance characteristics.

Furthermore, the present invention relates to a high voltage semiconductor device and a method of manufacturing the same, in which a lightly doped source region is formed through a photoresist mask on a substrate to define a body region, such that it is possible to omit a separate process for forming the source region.

In order to achieve the above objects, the present invention is realized by various embodiments having the following features.

A high voltage semiconductor device includes a drift region on a first side of a substrate, a drain region in the drift region, a body region on a second side of the substrate spaced apart from the drift region, a gate electrode on the substrate spaced apart from the drain region, a gate dielectric layer between the gate electrode and the substrate, and a spacer on an outer sidewall of the gate electrode but not on an inner sidewall of the gate electrode.

The device may further include a source region in the body region, and a body contact region in contact with a side surface of the source region.

The source region may be a second-conductivity-type lightly doped region.

The source region may be between a pair of adjacent gate electrodes and may extend along a space between the adjacent gate electrodes in the body region.

The source region and the body region may be defined using a same photoresist mask.

The device may further include a silicide layer on the source region, the body contact region, the gate electrode and/or the drain region.

The device may further include a field oxide between the gate electrode and the drain region.

Alternatively, the present invention relates to a high voltage semiconductor device that includes a drift region on a first side of a substrate, a body region on a second side of the substrate spaced apart from the drift region by a predetermined distance, a gate electrode on the substrate in over the drift region (or a part of the drift region) and a side or edge of the body region, a gate dielectric layer between the gate electrode and the substrate, a lightly doped second-conductivity-type source region in the body region, and a body contact region in contact with a side surface of the source region.

The source region may be between a pair of adjacent gate electrodes and may extend along a space between the adjacent gate electrodes in the body region.

The device may further include a spacer only on an outer sidewall of the gate electrode.

Furthermore, the present high voltage semiconductor device may include a drift region on a first side of a substrate, a body region on a second side of the substrate spaced apart from the drift region by a predetermined distance, a gate electrode on a surface of the substrate over the drift region (or a part of the drift region) and a side or edge of the body region, a gate dielectric layer between the gate electrode and the substrate, a second-conductivity-type lightly doped source region in the body region defined by a photoresist pattern that also defines the body region, and a body contact region in contact with a side surface of the source region.

The source region may be between a pair of adjacent gate electrodes or may extend along a space between the adjacent gate electrodes in the body region.

A method of manufacturing a high voltage semiconductor device may include forming a drift region in a substrate, depositing a gate film on the substrate, forming a photoresist pattern on the gate film and etching the gate film to form an outer sidewall of a gate electrode, forming a spacer on the outer sidewall of the gate electrode, etching the gate film at a position that is a predetermined distance inward from the outer sidewall of the gate electrode, and forming a body region and a source region a predetermined distance from the drift region (e.g., at the position where the gate film was etched, the predetermined distance inward from the outer sidewall of the gate electrode).

The source region and a body region may be defined using a same first photoresist pattern.

The source region may be between a pair of adjacent gate electrodes or may extend along a space between the adjacent gate electrodes in the body region.

An alternative method of manufacturing a high voltage semiconductor device may include forming a drift region in a substrate, depositing a gate film on the substrate, forming a source region in the body region using a first photoresist pattern as a mask a predetermined distance from the drift region and between a pair of adjacent gate electrodes, forming a heavily doped drain region in the drift region, and forming a body contact region in the body region.

The source region may be a substantially uniform second-conductivity-type lightly doped region.

The present invention has the following effects with the above-described configuration(s).

According to various embodiments of the present invention, forming a heavily doped region having a narrow width in the body region is not required, and it is not necessary to form a photoresist mask on the substrate in the space between a pair of adjacent gate electrodes, or to form the mask with a predetermined minimum width for the formation of the heavily doped region, thereby reducing the width of the body region.

In addition, according to various embodiments of the present invention, the width of the body region is reduced, thereby reducing the size of the semiconductor device and improving the specific on-resistance characteristics of the semiconductor device.

In addition, according to various embodiments of the present invention, a separate process for forming an N+ source region is omitted, simplifying the manufacturing process and reducing the manufacturing cost.

In addition, a separate process for forming an N+ source region is omitted, thereby overcoming design rule limitations that restrict formation of a photoresist pattern for the source region.

In addition, a spacer is not formed on the sidewall of the gate electrode adjacent to the source region, thereby reducing the width of the body region by the width of the spacer, and thus miniaturizing the semiconductor device and improving its specific on-resistance characteristics.

Furthermore, according to various embodiments of the present invention, a lightly doped source region is formed using the same photoresist mask as that used to define the body region, thereby omitting a separate process for forming the source region, and simplifying the manufacturing process.

Meanwhile, it should be understood that other advantageous effects not described in this description and/or that may be apparent from this description also fall within the scope of the invention.

DESCRIPTION OF THE PREFERRED EMBODIMENTS

Hereinafter, embodiments of the present invention will be described in detail with reference to the accompanying drawings. Various changes to the following embodiments are possible and the scope of the present invention is not limited to the following embodiments. The patent right of the present invention should be defined by the scope and spirit of the invention as disclosed in the accompanying claims. In addition, embodiments of the present invention are intended to fully describe the present invention to a person having ordinary knowledge in the art to which the present invention pertains.

Hereinafter, when it is described that a component (or a layer) is referred to as being "on" another component (or another layer), it should be understood that the component is directly on the other component, or one or more intervening components (or layers) are also present. In contrast, when it is described that a component is referred to as being directly on to another component, it should be understood that there is (are) no intervening component(s) present. In addition, terms indicating positions, such as, being located "on", "upper", "lower", "one side", and "the other side" are intended to mean a relative position of the components.

In addition, it will be understood that, although the terms first, second, third, etc. may be used herein to describe various elements, components, regions, and/or sections, these elements, components, regions, and/or sections should not be limited by these terms.

In addition, when a certain embodiment may be implemented differently, a specific process order may be performed differently from the described order. For example, two consecutively described processes may be performed substantially at the same time or performed in an order opposite to the described order.

As used herein, the term "metal-oxide-semiconductor" (MOS) is a general term, but is not limited to metal with respect to the term metal (M), but may include or be made of various types of conductors. In addition, the term semiconductor (S) may be a substrate or a semiconductor structure, and the term oxide (O) is not limited to oxides but may include various types of organic or inorganic materials (e.g., insulating and/or dielectric materials).

Further, a conductivity type or a doped region of the components may be defined as a p-type or an n-type depending on the characteristics of the main carrier, but this is merely for convenience of explanation, and the technical idea(s) of the present invention are not limited to the examples given. For example, "p-type" and "n-type" may be represented by the more general terms "first conductivity type" and "second conductivity type", where the first conductivity type may mean p-type, and the second conductivity type may mean n-type.

It should be understood that terms "high concentration" and "low concentration" may express a doping level, dose and/or concentration of an impurity region, and may refer to a relative doping concentration of one component with respect to one or more other components.

Hereinafter, N-channel LDMOS devices will be described as examples. However, this is merely for convenience of explanation and the scope of the present invention is not limited to the examples. Therefore, in addition to P-channel LDMOS devices, it should be understood that various semiconductor devices and circuits may be or include a combination of P-channel LDMOS and N-channel LDMOS devices and/or features by applying various modifications and changes within the spirit and the scope of the present invention.

Hereinafter, a high voltage semiconductor device and a method of manufacturing the same according to embodiments of the invention will be described in detail with reference to the accompanying drawings.

Figure 3:
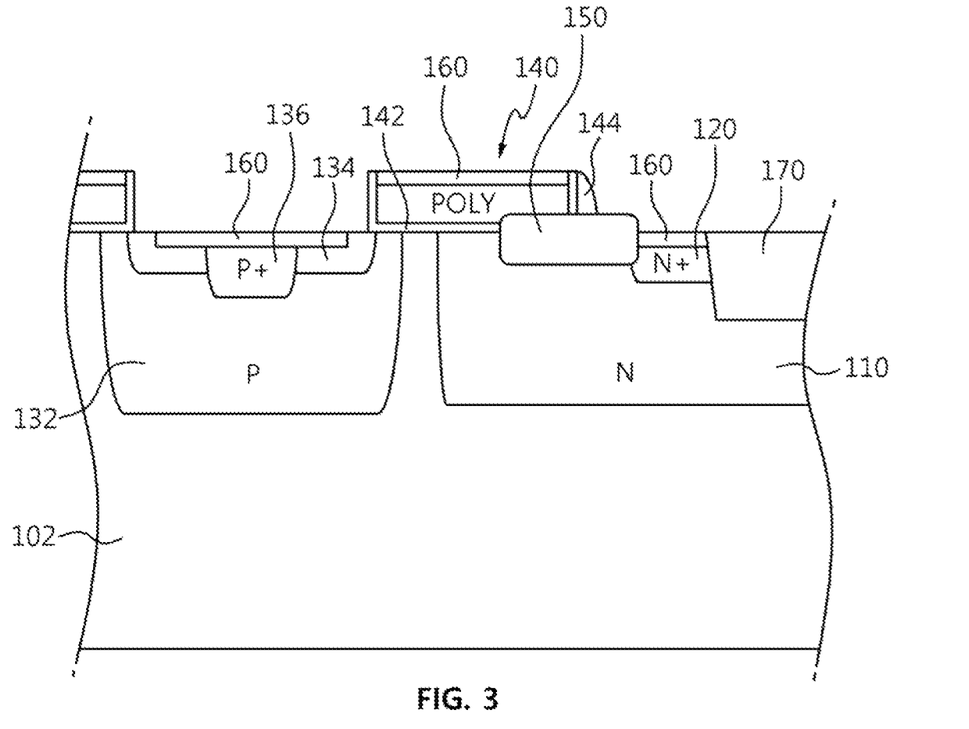
FIG. 3 is a cross-sectional view illustrating an exemplary high voltage semiconductor device, according to various embodiments of the present invention.

FIG. 3 is a cross-sectional view illustrating a high voltage semiconductor device according to embodiments of the present invention. FIGS. 4 to 9 are cross-sectional views illustrating processes for manufacturing the high voltage semiconductor device of FIG. 3.

Referring to FIG. 3, a semiconductor device 100 according to various embodiments of the present invention includes a first conductivity type substrate 102. The substrate 102 may be a first conductivity type (e.g., p-type) doped substrate, a first conductivity type diffusion region in the substrate, or a first conductivity type epitaxial layer epitaxially grown on the substrate. In addition, the substrate 102 may be configured with a well region (not shown) as an active region, and the active region may be defined at least in part by an isolation layer 170. The isolation layer 170 may be formed by a shallow trench isolation (STI) method.

A second conductive type drift region 110 is on a first side of a surface of the substrate 102 or on a first or outer side of a gate electrode 140. The drift region 110 is a predetermined distance apart from a body region 132 that will be described later. In addition, a second-conductivity-type impurity region may serve as the drift region 110. When the doping concentration in the drift region 110 is lower than a predetermined level, the specific on-resistance (Rsp) characteristics deteriorate. Conversely, when the doping concentration is increased to a predetermined level or higher, the specific on-resistance (Rsp) characteristics are improved, but the breakdown voltage characteristics deteriorate. Thus, the present invention may provide an impurity region having an appropriate level of doping concentration in consideration of the on-resistance and breakdown voltage characteristics of the LDMOS device. In various embodiments, the drift region 110 has a doping concentration lower than (and a depth greater than) that of a drain region 120, which will be described below.

In addition, the drain region 120 is in the drift region 110, spaced a predetermined distance apart from a gate electrode 140 on the substrate 102 and partially in the drift region 110. A second-conductivity-type heavily doped region may serve as the drain region 120 and have a doping concentration higher than (and a depth less than) that of the drift region 110.

In addition, the first conductivity type body region 132 is on a second side of the substrate 102 and/or on a second or inner side of the gate electrode 140, spaced apart from the drift region 110. In some embodiments, the body region 132 has a doping concentration higher than that of the first conductivity type substrate 102. Thus, it is possible to prevent a depletion region from becoming larger than a predetermined size, thereby facilitating channel formation.

A second conductivity type source region 134 is in the body region 132, on the second or inner side of the gate electrode 140. In addition, a first-conductivity-type body contact region 136 may penetrate or otherwise go through the source region 134. A side surface of the body contact region 136 and a side surface of the source region 134 may be in contact with each other. The body contact region 136 has a doping concentration higher than that of the body region 132 and, optionally, greater than that of the source region 134. For example, the body contact region 136 may be a P+ doped region having a doping concentration higher than that of the body region 120 and of the source region 134.

Referring to FIG. 3, unlike the conventional source region comprising an N+ type doped region and source/drain extension region, the source region 134 of the high voltage semiconductor device 100 according to various embodiments of the present invention is a second-conductivity-type lightly doped region. The source region 134 may be an N type moderately-doped region having a doping concentration lower than that of the conventional N+ doped region, or may be an N− doped region. In addition, referring to FIG. 7, the source region 134 may be in and/or extend along a space A1 between a pair of adjacent gate electrodes 140 and in the body region 132. More specifically, the source region 134, which is in contact with the body contact region 136 and is below the adjacent gate electrodes 140, or which is under and partially overlapping with the gate electrodes 140, may be a substantially uniform lightly doped region. Accordingly, the source region 134 may have a width (lateral length) larger than the conventional N+ type doped region. The source region 134 may be, for example, a region corresponding to a conventional moderately-doped region (i.e., a source/drain extension region or so-called or "lightly-doped drain" [LDD] structure). A separate process for forming the N+ type source region in the conventional method may be omitted, and specifically, the process shown in FIG. 2 is not required. Therefore, the manufacturing process may be simplified and the manufacturing cost may be reduced.

Hereinafter, advantageous effects produced by forming the source region 134 as a lightly doped region will be described. Referring to FIG. 2, to form a heavily doped region and a lightly doped extension region conventionally, a photoresist mask is formed in a space A1 between a pair of adjacent gate electrodes 510 using a photoresist pattern in the space other than a position where the heavily doped region and the extension region are to be formed. When the photoresist pattern is less than a predetermined width, the photoresist profile (PR profile) may change, or the photoresist may deform and attach to a sidewall of an adjacent gate electrode 510, and thus it may be difficult to form the source region. Accordingly, to prevent the above problems, the mask has a width equal to or greater than a predetermined size. As a result, the body region has a relatively large width. In this case, the size of the semiconductor device increases, and its specific on-resistance (Rsp) characteristics deteriorate.

Figure 7:
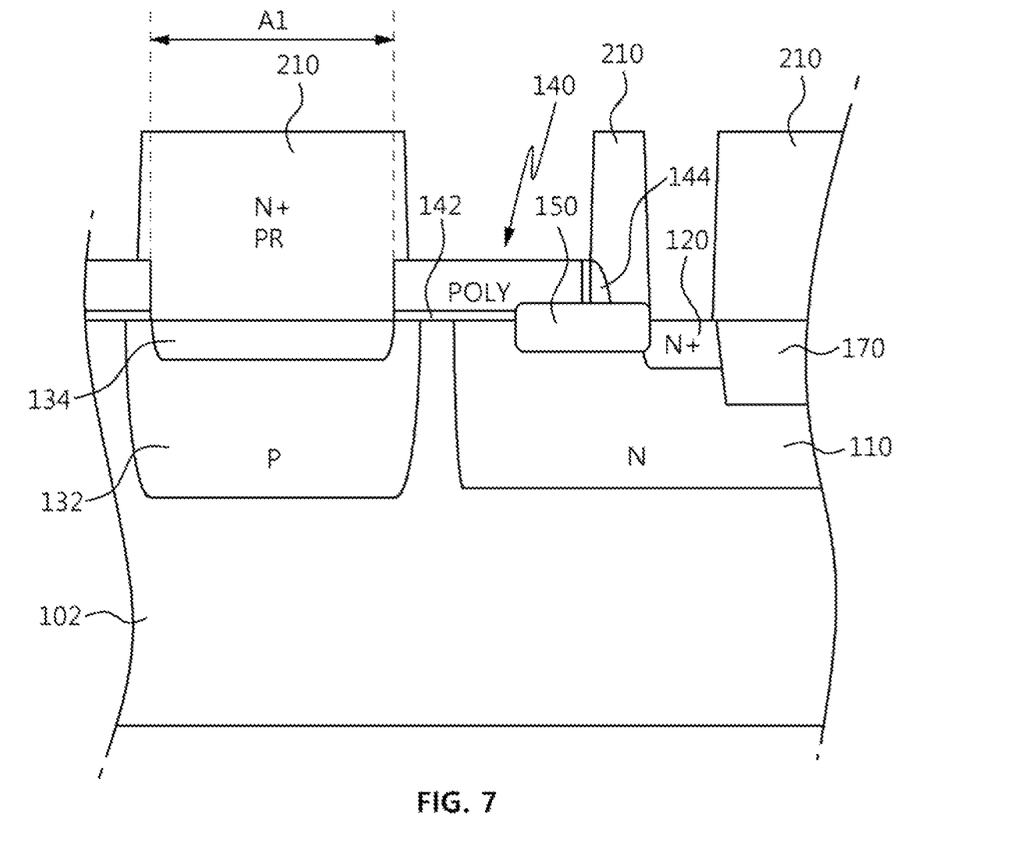
FIG. 7 is a cross-sectional view illustrating an exemplary process of forming a drain region, according to an embodiment of the present invention.

Referring to FIG. 7, the source region 134, which is a lightly doped region according to embodiments of the present invention, is not formed using a narrow photoresist mask as described above for forming the body contact region 136 and the N+ doped region in the space between the gate electrodes 140. Therefore, it is not necessary to form the body region with a width corresponding to the width of the mask to ensure that the mask has a width equal to or greater than a predetermined size. Therefore, unlike conventional LDMOS semiconductor devices, the width of the body region 132 may be reduced, and thus it is possible to improve the Rsp characteristics and reduce the size of the semiconductor device.

Further, as will be described in detail below, the source region 134 according to various embodiments of the present invention corresponds to an existing source/drain extension region. As a result, the source region 134 is advantageous in that the formation of the source region 134 does not require a separate process, such as photoresist mask formation for forming only the source region 134, unlike the conventional source formation process.

Referring to FIG. 3, the gate electrode 140 is on the substrate 102, and a gate dielectric layer 142 is between the gate electrode 140 and the substrate 102. A first end or sidewall of the gate electrode 140 may be on or over an end or edge of the source region 134, and may partially overlap with the source region 134. A second end or sidewall of the gate electrode 140 may be on or over the field oxide 150 adjacent to an end or edge of the drain region 120. In addition, the gate electrode 140 may comprise or be made of a material selected from the group consisting of conductive polysilicon, metals, conductive metal nitrides, and combinations thereof, and may be formed by chemical vapor deposition (CVD), physical vapor deposition (PVD; e.g., sputtering), atomic layer deposition (ALD), metal-organic ALD (MOALD), or metal-organic CVD (MOCVD).

The gate dielectric layer 142 may comprise or be made of a material selected from the group consisting of a silicon oxide film, a high-κ dielectric film, and combinations thereof. In addition, the gate dielectric layer 142 may be formed by wet or dry thermal oxidation or ALD, CVD, or PVD.

One sidewall of the gate electrode 140 may have a spacer 144 thereon, and the spacer 144 may comprise or be made of a material selected from the group consisting of an oxide film (e.g., silicon dioxide), a nitride film (e.g., silicon nitride), and combinations thereof. The gate electrode 140 according to various embodiments of the present invention has a sidewall adjacent to the drain region 120 that is capped with the spacer 144. That is, no spacer 144 is on the other sidewall of the gate electrode 140 adjacent to the source region 134. Hereinafter, the sidewall of the gate electrode 140 adjacent to the source region 134 is referred to as an "inner" sidewall of the gate electrode 140, and the other sidewall of the gate electrode 140 (e.g., adjacent to the drain region 120) is referred to as an "outer" sidewall of the gate electrode 140. The terms "inner" and "outer" may have similar or identical meanings when used with respect to other structures or features of the present LDMOS device. That is, regarding to the high voltage semiconductor device 100 according to embodiments of the present invention, the spacer 144 is not on the inner sidewall of the gate electrode 140, but on the outer sidewall of the gate electrode 140. In the drawings, a direction from the gate electrode 140 to the adjacent drain region 120 is referred to as an "outward" direction, and a direction from the gate electrode 140 to the adjacent source region 134 is referred to as an "inward" direction.

Hereinafter, advantageous effects of the spacer 144 not being on the inner sidewall of the gate electrode 140 adjacent to the source region 134 will be described in detail. As described above with reference to FIG. 2, to form an N+ (high concentration) doped region conventionally, a mask is formed in the space A1 between adjacent gate electrodes using a photoresist pattern in the space other than where the N+ doped region is to be formed. Thus, the width of the space A1 is relatively narrow due to the spacers 512 on the adjacent gate electrodes 510 facing each other. Accordingly, the width of the body region 530 is increased to compensate for the width of the space A1 being narrowed by the adjacent spacers 512.

Referring to FIG. 7, the semiconductor device 100 according to embodiments of the present invention does not have spacers on the sidewalls of the adjacent gate electrodes 140 facing each other in the space A1. As a result, it is possible to make the width of the body region 132 narrower, while the width of the source region 134 is the same or larger. Also, the N+ doped region 532 is not formed, and the spacer (e.g., spacer 144) is not on an inner side of the gate electrode 140, thereby reducing or minimizing the width of the body region 132, and enabling miniaturization of the semiconductor device and improvement of its Rsp characteristics.

Referring to FIG. 3, in the high voltage semiconductor device 100, a field oxide 150 may be in a space between the gate electrode 140 and the drain region 120 to prevent the electric field from concentrating at the edge of the gate electrode 140.

A silicide layer 160 is on the source region 134, the body contact region 136, the gate electrode 140, and/or the drain region 120. In general, a self-aligned silicide process (e.g., a salicide process), in which the silicide film 160 is formed using a metal film of cobalt (Co), nickel (Ni), titanium (Ti), tungsten (W) or the like is performed on the LDMOS device to improve contact resistance and thermal stability.

Hereinafter, a method of manufacturing a high voltage semiconductor device according to various embodiments of the present invention will be described in detail.

Figure 4:
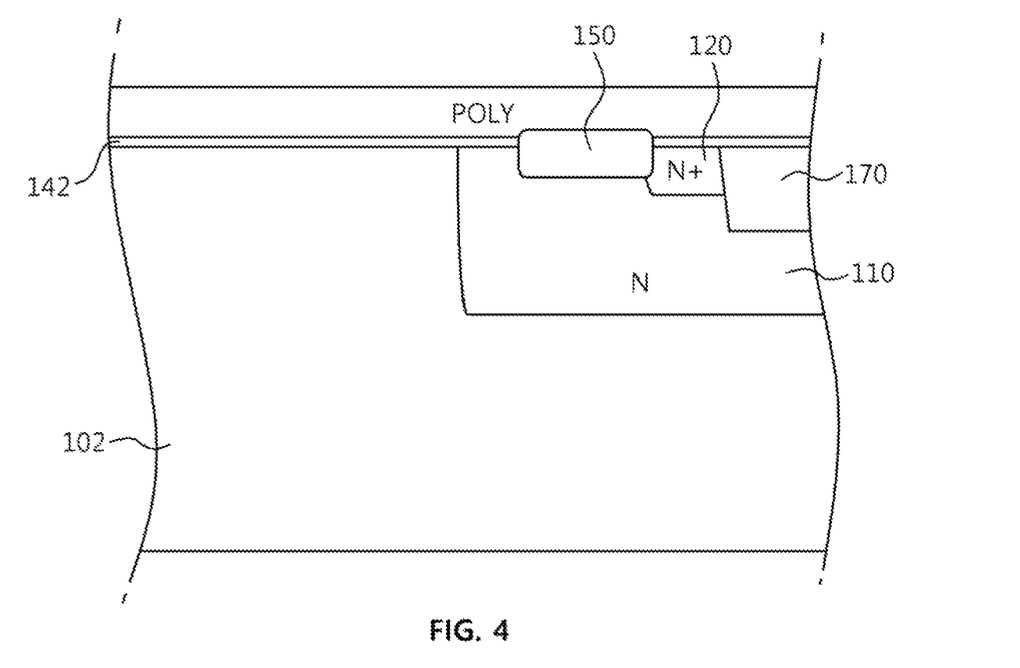
FIG. 4 is a cross-sectional view illustrating an exemplary process of forming a drift region, an isolation layer, a field oxide, a gate dielectric layer, and a gate film, according to various embodiments of the present invention.

FIG. 4 is a cross-sectional view illustrating a process of forming a drift region, an isolation layer, a field oxide, a gate dielectric layer, and a gate film according to embodiments of the present invention.

A photoresist pattern (not shown) is formed on a surface of a substrate 102 to define a well region, and the well region may be formed by an ion implantation process in which the photoresist pattern is used as an ion implantation mask. In addition, the well region may have the second conductivity type. For example, the second conductivity type well region may be formed by performing the ion implantation process using an n-type dopant, for example containing arsenic and/or phosphorus. In some embodiments, forming the well region may further include a subsequent heat treatment process. As described above, the substrate 102 may be a p-type doped substrate, a p-type diffusion region in the substrate, or a p-type epitaxial layer epitaxially grown on the substrate.

Thereafter, referring to FIG. 4, the photoresist pattern is removed (e.g., by stripping and ashing), and an isolation layer 170 is then formed to define an active region of the LDMOS device. As described above, the isolation layer 170 may be formed by the STI method.

Then, a second photoresist pattern (not shown) for forming a drift region 110 is formed on the substrate 102 (e.g., on a surface of the active region), and the second-conductivity-type drift region 110 is formed by performing, for example, another ion implantation process. In addition, a field oxide 150 may be formed in the drift region 110 (e.g., adjacent to a location of a subsequently-formed drain region 120) by performing a local oxidation of silicon (LOCOS) process.

After forming the drift region 110, the second photoresist pattern is removed by the same or substantially the same process as the first photoresist pattern, then a gate dielectric layer 142 is formed on the surface of the active region and/or the substrate 102. For example, the gate dielectric layer 142 may be formed by wet or dry thermal oxidation (e.g., at a temperature of from 800° to 1050°, in an atmosphere including dioxygen). The gate dielectric layer 142 may have a thickness of from 45 to 120 Å. Then, a gate film comprising, for example, conductive polysilicon is deposited on the gate dielectric layer 142. It should be noted that the gate film may comprise or be made of a material selected from the group consisting of conductive polysilicon, metals, conductive metal nitrides, and combinations thereof. In addition, the gate dielectric layer 142 may comprise a material selected from the group consisting of a silicon oxide film, a high-k dielectric film, and combinations thereof.

Figure 5:
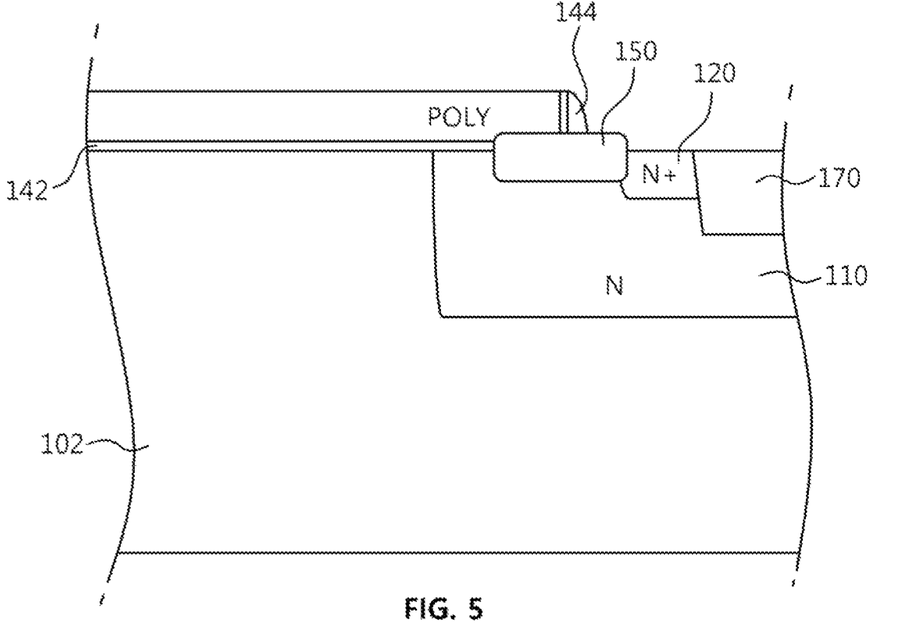
FIG. 5 is a cross-sectional view illustrating an exemplary process of forming a spacer on an outer sidewall of a gate electrode, according to various embodiments of the present invention.

FIG. 5 is a cross-sectional view illustrating a process for forming a spacer on an outer sidewall of a gate electrode according to embodiments of the present invention.

Referring to FIG. 5, after forming a third photoresist pattern (not shown) on the gate film defining the outer sidewall of the gate electrode 140, the deposited gate film and the gate dielectric layer 142 are sequentially etched to form the outer sidewall of the gate electrode 140 over the drift region 110 and the field oxide 150.

The third photoresist pattern is removed by the same or substantially the same process as the first photoresist pattern, then a dielectric layer is deposited on the etched and/or remaining gate film, the outer sidewall of electrode 140, the field oxide 150, the drain region 120 and the isolation layer 170 by, for example, chemical vapor deposition (CVD), and anisotropic dry etching is performed to form the spacer 144 on the outer sidewall of the gate electrode 140. In various embodiments, the spacer 144 is formed only on the outer sidewall of the gate electrode 140 (for example, by subsequent etching of the remaining gate film to form the inner sidewall; see the description of FIG. 6 below). Accordingly, a clearance space having a size corresponding to twice the width of the spacer 144 is produced in a space A1 between adjacent gate electrodes 140, enabling a sufficient width for the formation of a subsequent photoresist pattern 210 and/or 220 (FIGS. 7-8) in the space A1. Therefore, the width of the body region 132 may be reduced, whereby it is possible to miniaturize the semiconductor device and improve its Rsp characteristics.

Figure 6:
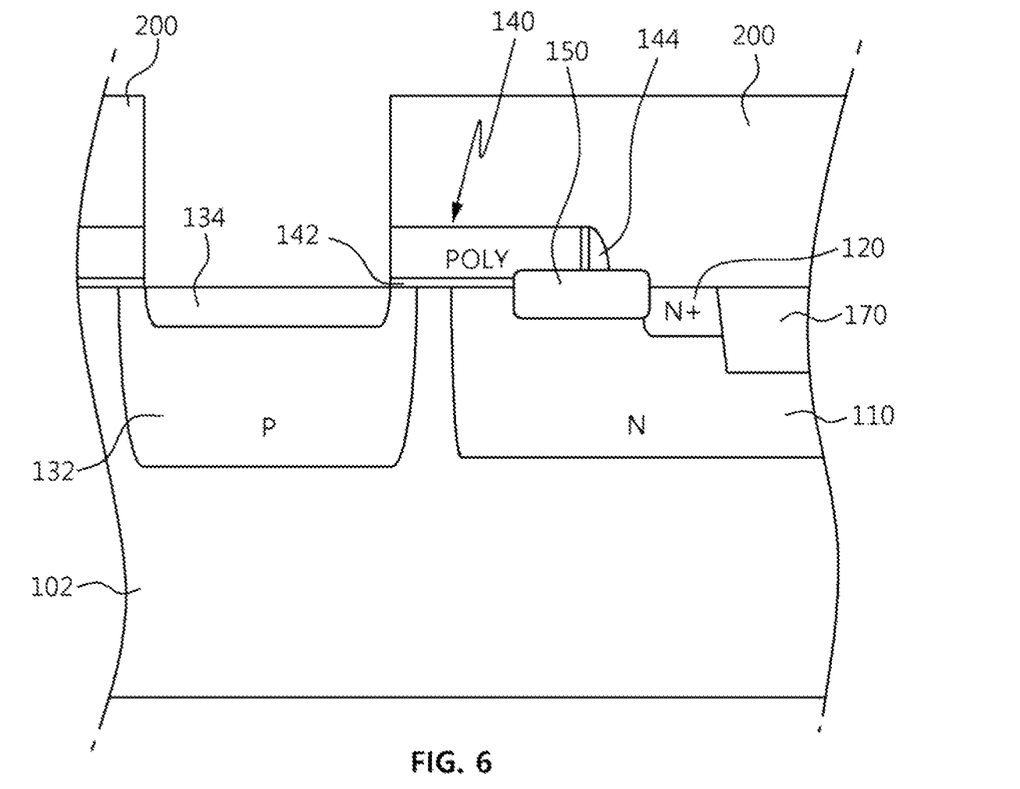
FIG. 6 is a cross-sectional view illustrating an exemplary process of forming lightly doped body and source regions, according to various embodiments of the present invention.

FIG. 6 is a cross-sectional view illustrating a process of forming the body region and the source region, which is a lightly doped region, according to embodiments of the present invention.

Referring to FIG. 6, after forming the spacer 144 on the outer sidewall of the gate electrode 140, the gate film in the area or region where the body region 132 is to be formed is etched.

After forming a fourth photoresist pattern 200 and exposing part of the etched and/or remaining gate film, the exposed part of the gate film and underlying gate dielectric layer 142 are etched in the same way or manner as described for forming the outer sidewall of the gate electrode 140 to define or form the inner sidewall of the gate electrode 140, then the first-conductivity-type body region 132 is formed by performing, for example, an ion implantation process in which the fourth photoresist pattern is used as an ion implantation mask. In addition, a second-conductivity-type lightly doped source region 134 is formed by performing, for example, a separate ion implantation process using the same photoresist pattern 200. As described above, the source region 134 is the second-conductivity-type lightly doped region, and may be an N-type moderately-doped region or an N− doped region having a doping concentration lower than that of the conventional N+ doped region. The ion implantation for the source region 134 may include a higher dose of dopant and may be performed at a lower energy than the ion implantation for the body region 132. In addition, the source region 134 may be in the space A1 between the pair of adjacent gate electrodes 140 and in the body region 132. Accordingly, the source region 134 is configured to have a width (lateral length) larger than the conventional N+ type doped region. Thus, as described above, it is not required to form a narrow photoresist mask to form an N+ doped region, nor is it necessary to form a source extension region (e.g., as in a conventional LDD structure) between the adjacent gate electrodes 140. Accordingly, it is not required to form the body region with a width to ensure a width of the N+ doped region photoresist mask equal to or greater than a predetermined size. Thus, unlike the conventional semiconductor device, the width of the body region 132 may be reduced, whereby it is possible to improve the Rsp characteristics and further reduce the size of the semiconductor device.

FIG. 7 is a cross-sectional view illustrating a process of forming a drain region according to embodiments of the present invention.

Referring to FIG. 7, after removing the fourth photoresist pattern 200 (e.g., by a process similar or identical to that used to remove the other photoresist patterns), a fifth photoresist pattern 210 is formed on the active region and/or the substrate 102 (including the space A1 between the pair of adjacent gate electrodes 140), exposing a region between the field oxide 150 and the STI region 170 for forming a drain region 120. Thus, the drain region 120 shown in FIGS. 4-5 may not be present during or as a result of the processes described with respect to FIGS. 4-5. The second-conductivity-type heavily doped drain region 120 is formed by performing, for example, an ion implantation process using the pattern 210 as an ion implantation mask. Depending on the depth of the drain region 120 relative to the thicknesses of the field oxide 150 and the STI region 170, the photoresist pattern 210 may omit some or all of the portions thereof over the spacer 144, the field oxide 150, and/or the STI region 170. Also, the gate electrode 140 may be exposed or covered by the second photoresist pattern 210. The dose of the dopant in the ion implantation process for forming the drain region 120 is greater than the corresponding dose of the dopant in the ion implantation process for forming the source region 134, and the energy of the ion implantation process for forming the drain region 120 may be about the same as or greater than the corresponding energy of the ion implantation process for forming the source region 134.

Figure 8:
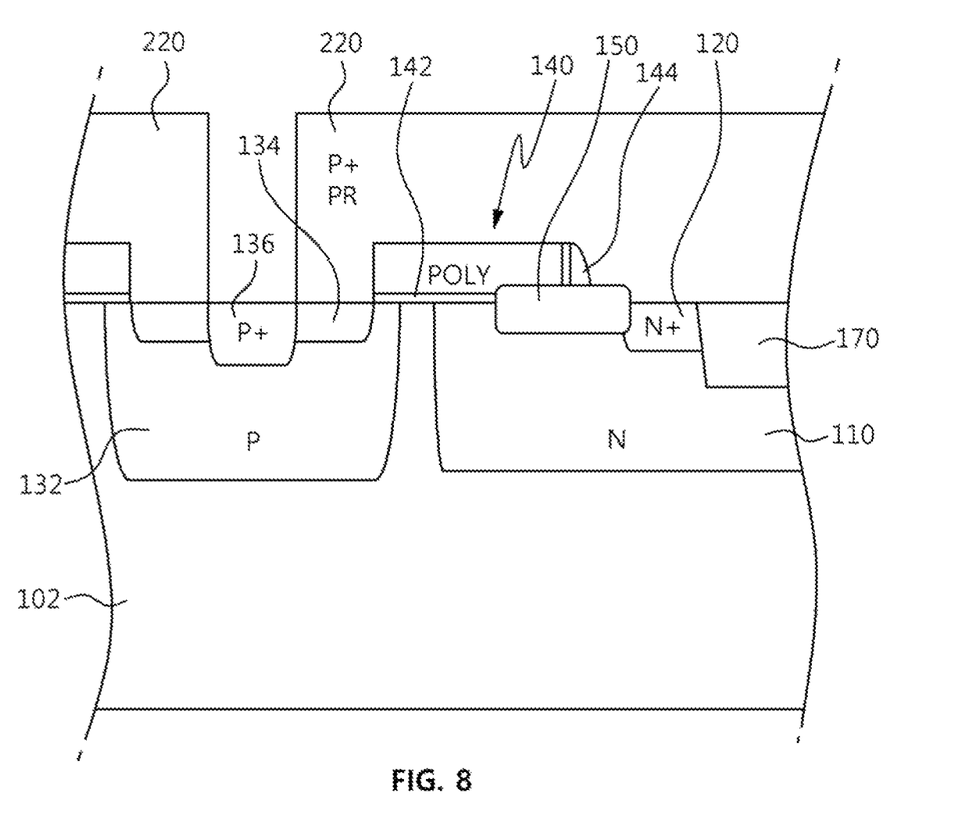
FIG. 8 is a cross-sectional view illustrating an exemplary process of forming a body contact region, according to an embodiment of the present invention.

FIG. 8 is a cross-sectional view illustrating a process of forming a body contact region according to an embodiment of the present invention.

Referring to FIG. 8, after forming the drain region 120, the fifth photoresist pattern 210 is removed by a process similar or identical to that used to remove the other photoresist patterns, and a sixth photoresist pattern 220 is formed on the substrate 102, the gate electrode 140, and the active region, exposing a region for forming a body contact region 136. The first-conductivity-type body contact region 136 is formed by performing, for example, an ion implantation process using the pattern 220 as an ion implantation mask. The ion implantation process may implant a P-type dopant at a higher dose than the process for forming the body region 132, but at a lower energy than the process for forming the body region 132. The depth of the body contact region 136 is greater than the depth of the source region 134.

Figure 9:
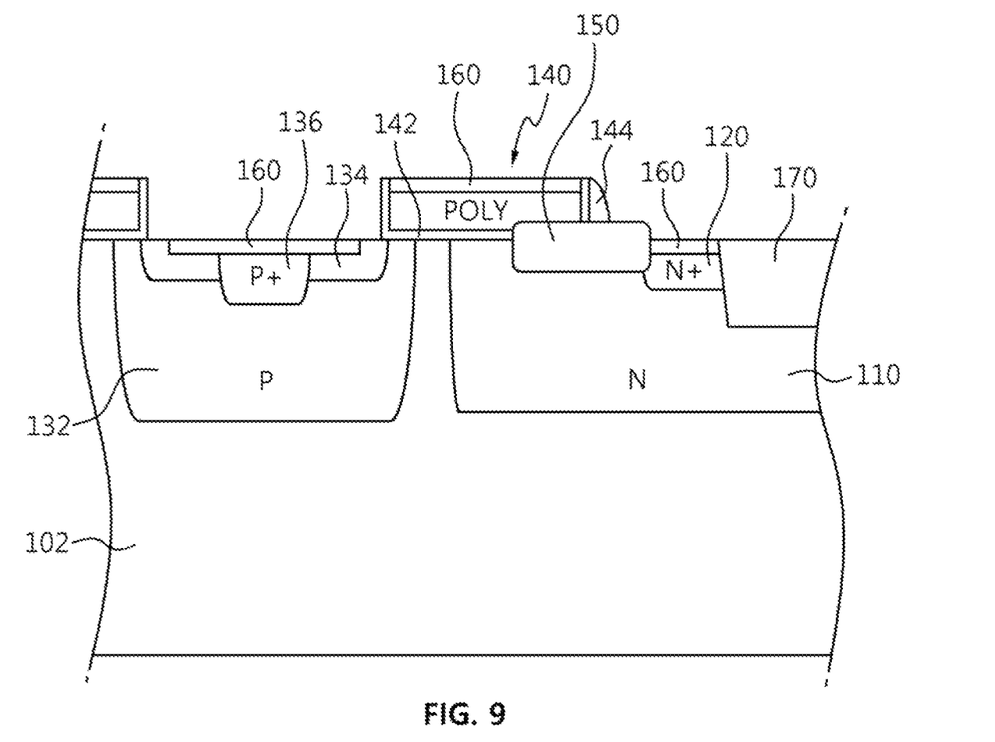
FIG. 9 is a cross-sectional view illustrating an exemplary process of forming a silicide layer, according to various embodiments of the present invention.

FIG. 9 is a cross-sectional view illustrating a process of forming a silicide layer according to embodiments of the present invention.

Referring to FIG. 9, a self-aligned silicide process (e.g., salicide process) is performed to form the silicide layer 160 on the drain region 120, the source region 134, the body contact region 136, and/or the gate electrode 140 by using a metal film comprising or consisting essentially of cobalt (Co), nickel (Ni), titanium (Ti), tungsten (W) or the like to improve contact resistance and thermal stability. The silicide layer 160 on the source region 134 may cover the entire exposed source region 134.

The foregoing description illustrates and describes the present invention. Additionally, the disclosure shows and describes various embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. In addition, it is intended that the appended claims be construed to include alternative embodiments.

What is claimed is:

1. A high voltage semiconductor device comprising:
a drift region on a first side of a substrate;
a drain region in the drift region;
a first-conductivity-type body region on a second side of the substrate, spaced apart from the drift region;
a gate electrode on the substrate spaced apart from the drain region;
a gate dielectric layer between the gate electrode and the substrate; and
a source region in the body region; and
a spacer on an outer sidewall of the gate electrode and not on an inner sidewall of the gate electrode,
wherein the source region is a second-conductivity-type lightly doped region.

2. The device of claim 1, further comprising:
a body contact region in contact with a side surface of the source region.

3. The device of claim 2, wherein the source region is between a pair of adjacent gate electrodes.

4. The device of claim 2, wherein the source region and the body region are defined by a same photoresist mask.

5. The device of claim 4, further comprising:
a silicide layer on the source region, the body contact region, the gate electrode, and/or the drain region.

6. The device of claim 4, further comprising:
a field oxide between the gate electrode and the drain region.

7. A high voltage semiconductor device comprising:
a drift region on a first side of a substrate;
a first-conductivity-type body region on a second side of the substrate spaced apart from the drift region by a predetermined distance;
a gate electrode on a surface of the substrate over the drift region and a side or edge of the body region;
a gate dielectric layer between the gate electrode and the substrate; and
a lightly doped second-conductivity-type source region in the body region, wherein the source region and the body region are defined by a same photoresist mask.

8. The device of claim 7, wherein the source region is between a pair of adjacent gate electrodes.

9. The device of claim 8, further comprising:
a body contact region in contact with a side surface of the source region,
wherein the source region is a substantially uniform lightly doped second-conductivity-type region, the source region contacts the body contact region and is below the pair of adjacent gate electrodes or partially overlaps with the pair of adjacent gate electrodes.

10. The device of claim 7, further comprising:
a spacer on only an outer sidewall of the gate electrode.

11. The device of claim 7, further comprising:
a source region in the body region; and
a body contact region in contact with a side surface of the source region,
wherein the second-conductivity-type source region is lightly or moderately doped.

12. A high voltage semiconductor device comprising: a drift region on a first side of a substrate;
a first-conductivity-type body region on a second side of the substrate spaced apart from the drift region by a predetermined distance;
a gate electrode on a surface of the substrate over the drift region and a side or edge of the body region;
a gate dielectric layer between the gate electrode and the substrate;
a second-conductivity-type lightly doped source region in the body region,
defined by a same photoresist pattern as the body region; and
a body contact region in contact with a side surface of the source region.

13. The device of claim 12, wherein the source region is between a pair of adjacent gate electrodes.

14. A method of manufacturing a high voltage semiconductor device, the method comprising:
forming a drift region in a substrate;
depositing a gate film on the substrate;
forming a photoresist pattern on the gate film defining an outer sidewall of a gate electrode, and etching the gate film exposed by the photoresist pattern to form the outer sidewall of the gate electrode;
forming a gate spacer on the outer sidewall of the gate electrode;
etching the gate film at a position that is a predetermined distance from the outer sidewall of the gate electrode; and then
forming a body region and a source region the predetermined distance spaced apart from the drift region by the predetermined distance.

15. The method of claim 14, wherein the source region and the body region are formed using a same photoresist pattern.

16. The method of claim 14, wherein the source region is a second-conductivity-type lightly doped region between a pair of adjacent gate electrodes, in the body region.

17. A method of manufacturing a high voltage semiconductor device, the method comprising:
forming a drift region in a substrate;
depositing a gate film on the substrate;
forming a source region and a body region using a same photoresist pattern a predetermined distance from the drift region and exposing a space between a pair of adjacent gate electrodes;
forming a heavily doped drain region in the drift region; and
forming a body contact region in the body region,
wherein the body region is a first-conductivity-type doped region and the source region is a substantially uniform second-conductivity-type lightly doped region, and the source region contacts the body contact region and is below the pair of adjacent gate electrodes or partially overlaps with the pair of adjacent gate electrodes.

\* \* \* \* \*